(12) United States Patent
Norte et al.

(10) Patent No.: US 6,933,805 B1
(45) Date of Patent: Aug. 23, 2005

(54) HIGH DENSITY CAPACITOR FILTER BANK WITH EMBEDDED FARADAY CAGE

(75) Inventors: David A. Norte, Westminster, CO (US); Woong K. Yoon, Westminster, CO (US)

(73) Assignee: Avaya Technology Corp., Basking Ridge, NJ (US)

( * ) Notice: Subject to any disclaimer, the term of this patent is extended or adjusted under 35 U.S.C. 154(b) by 14 days.

(21) Appl. No.: 10/636,342

(22) Filed: Aug. 6, 2003

(51) Int. Cl.[7] .............................. H03H 7/00; H01G 4/38
(52) U.S. Cl. ...................... 333/185; 333/12; 361/328
(58) Field of Search ................ 333/12, 185; 361/301.4, 361/328, 329

(56) References Cited

U.S. PATENT DOCUMENTS

| | | | |
|---|---|---|---|
| 4,499,524 A | * 2/1985 | Shioleno | 361/772 |
| 4,714,905 A | * 12/1987 | Bernstein et al. | 333/167 |
| 5,311,095 A | * 5/1994 | Smith et al. | 310/334 |
| 5,428,499 A | * 6/1995 | Szerlip et al. | 361/328 |
| 5,801,597 A | 9/1998 | Carter et al. | 333/12 |
| 5,914,644 A | 6/1999 | Carter et al. | 333/12 |
| 6,058,004 A | * 5/2000 | Duva et al. | 361/301.4 |

* cited by examiner

Primary Examiner—Dean Takaoka
(74) Attorney, Agent, or Firm—Sheridan Ross P.C.

(57) ABSTRACT

A high density capacitor filter bank for use in connection with printed circuit boards is provided. Capacitive elements are disposed within a conductive shield such that the capacitive elements are substantially orthogonal to the plane of the printed circuit board, and such that they can interconnect with corresponding contacts on the printed circuit board while occupying a minimal amount of surface area on the printed circuit board. The conductive shield may comprise a Faraday shield.

20 Claims, 4 Drawing Sheets

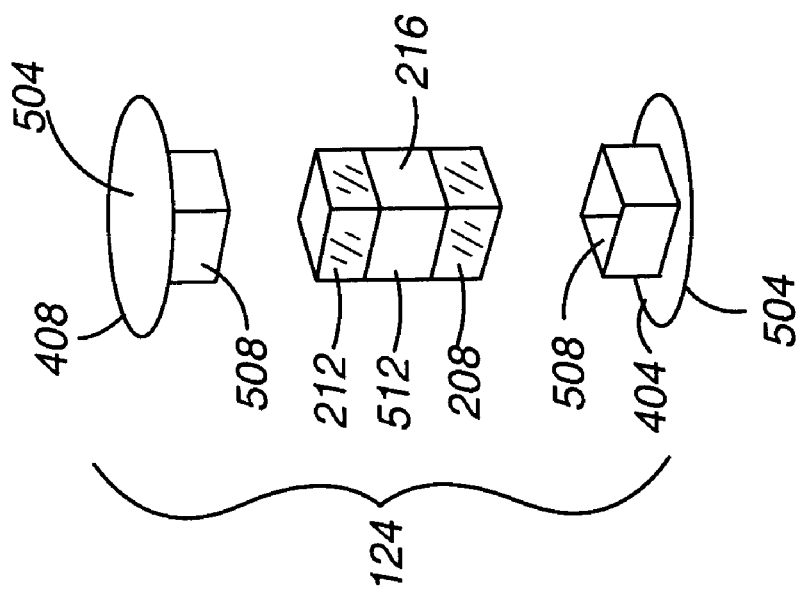
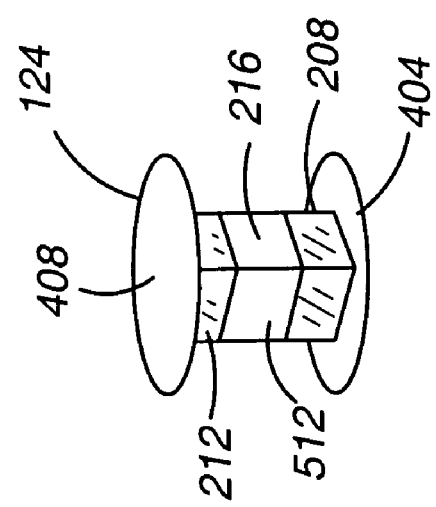

US 6,933,805 B1

HIGH DENSITY CAPACITOR FILTER BANK WITH EMBEDDED FARADAY CAGE

FIELD OF THE INVENTION

The present invention is directed to the reduction of noise in electrical circuits. In particular, the present invention is directed to the provision of an electrically shielded high density capacity filter bank for use in connection with printed circuit boards.

BACKGROUND OF THE INVENTION

One important consideration in the design of electrical circuits is electromagnetic compatibility (EMC). In particular, electromagnetic fields resulting from noise signals within electrical circuits must be held to within acceptable limits, in order to prevent interference with neighboring circuits. As the density with which electrical circuitry is packaged, and the sensitivity of such circuitry increases, the standards for EMC compliance have become increasingly stringent.

A particular problem within the field of electromagnetic compatibility is to provide effective filtering for a large number of closely spaced conductors, such as conductors associated with high density connectors. A high density connector that is interconnected to a printed circuit board (PCB) must have its pins electrically connected to the conductors of the PCB. Usually, one PCB conductor is mapped to each connector pin. Since PCB conductors propagate high frequency noise currents, it is highly desirable to provide effective filtering against these noise currents. Typically, such filtering is provided by using appropriately valued surface-mountable capacitors to shunt undesirable noise currents to ground, so that the noise currents can return to their sources. Such capacitors have been either embedded onto the high density connector, or they have been soldered onto the PCB, one for each conductor. In either approach, the capacitors are coplanar with the PCB conductors.

Because the capacitors used to shunt noise currents have been coplanar with the PCB conductors, some of the shunted noise currents can be recoupled back into the conductors, due to the magnetic fields from these noise currents being closely located to the conductors. This effect is caused by the phenomena of magnetic field coupling. In addition, where discrete capacitors are placed alongside PCB conductors, a significant amount of PCB real estate (or area) is required. In addition, the conductive traces necessary to connect the capacitors between the circuit and ground can be difficult to route.

Another problem encountered with such approaches is that the shunted high frequency noise currents propagate on one of the PCB surfaces for a short distance before reaching a ground plane, in which the noise currents can return to their sources. This can result in the free space propagation of the electromagnetic fields associated with the noise currents. Such free space propagation can contribute to EMC non-compliance.

SUMMARY OF THE INVENTION

The present invention is directed to solving these and other problems and disadvantages of the prior art.

According to an embodiment of the present invention, a high density capacitor filter bank is provided. The high density capacitor filter bank includes a number of capacitive elements substantially enclosed within a volume defined by a conductive shield. The capacitive elements are oriented such that, when the filter bank is interconnected to a printed circuit board (PCB), the recoupling of noise currents back onto the PCB conductors is reduced. In addition, the capacitive elements include a first terminal located substantially within a first plane for interconnection to a PCB conductor, and a second terminal, substantially located within a second plane and interconnected to the conductive shield, which is in turn connected to ground. This configuration limits the area of the PCB required by the filter bank. In addition, the provision of a shield limits the free space propagation of electromagnetic radiation.

In accordance with an embodiment of the present invention, the conductive shield comprises a Faraday shield formed from a substantially continuous sheet or sheets of conductive material. In accordance with another embodiment of the present invention, the conductive shield has no aperture with a maximum linear dimension greater than about $\frac{1}{30}$ of the wavelength of the highest frequency signal of concern.

BRIEF DESCRIPTION OF THE DRAWINGS

FIG. 4A is a perspective view of a capacitive element in accordance with an embodiment of the present invention;

FIG. 5A is an exploded view of the capacitive element of FIG. 4A;

DETAILED DESCRIPTION

Figure 1:
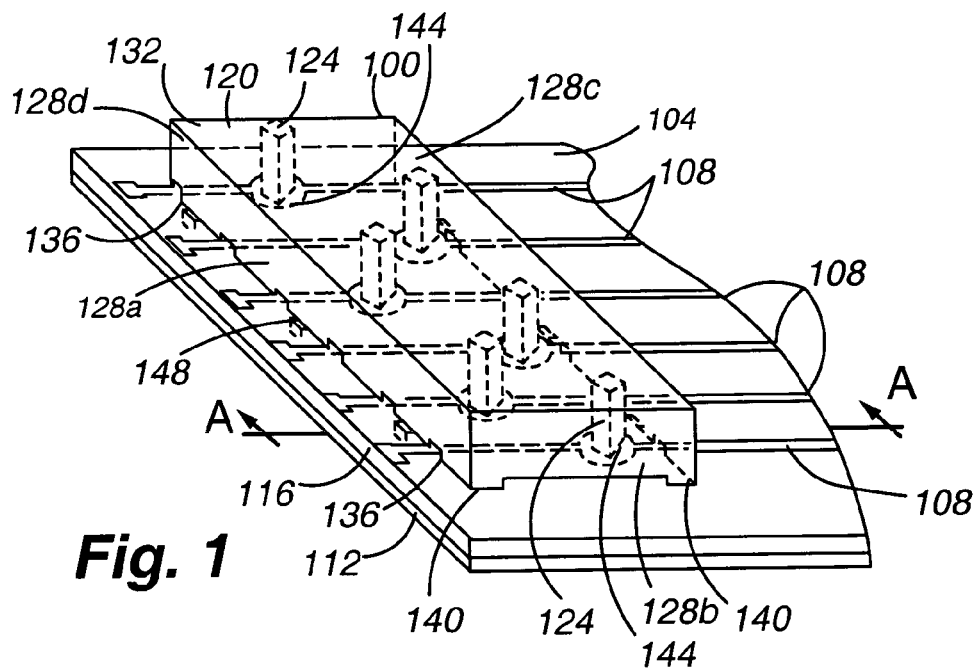
FIG. 1 is a perspective view of a filter bank in accordance with an embodiment of the present invention, interconnected to a printed circuit board.

With reference now to FIG. 1, a high density capacitor filter bank 100 in accordance with an embodiment of the present invention is shown interconnected to a printed circuit board (PCB) 104. As shown in FIG. 1, the printed circuit board 104 includes a number of conductive traces 108. As can be appreciated by one of skill in the art, the conductive traces 108 generally comprise electrical signal lines. As can also be appreciated by one of skill in the art, the conductive signal lines 108 shown on the visible surface of the printed circuit board 104 comprise a first conductive layer of the printed circuit board. In general, the printed circuit board 104 may comprise a conductive ground plane 112, separated from the conductive traces 108 by a dielectric substrate 116. Of course, various other configurations are possible. For example, a printed circuit board 104 may have more than two conductive layers (i.e., more than a single layer of conductive traces combined with a ground plane). Although the present invention is readily adaptable to any multiple layer PCB, for clarity of the present description, a PCB 104 having two conductive layers is shown.

The high density capacitor filter bank 100 generally includes a conductive shield 120 and a plurality of capacitive elements 124. In general, the conductive shield 120 is shaped such that it forms an enclosure defining a volume that substantially contains the capacitive elements 124. For instance, as illustrated in FIG. 1, the conductive shield 120 may be shaped like a rectangular box having four side surfaces 128a–d and a capacitive element attachment surface 132. The side of the box or enclosure opposite the capacitive element attachment surface 132 of the conductive shield 120 is defined by or adjacent to the surface of the PCB 104 when the high density capacitor filter bank 100 is interconnected to the PCB 104. Cutouts 136 may be formed in the side surfaces 128 of the conductive shield 120 so that direct electrical contact between the conductive traces 108 and the conductive shield 120 is prevented. Alternatively or in addition, mounting tabs 140 may be provided on the side surfaces 128 of the conductive shield 120 to form a gap between the side surfaces 128 of the conductive shield 120 and the conductive traces 108.

As will be described in greater detail herein, the conductive shield 120 provides an electrically conductive path for noise currents shunted from the conductive traces 108 by the capacitive elements 124, to the ground plane 112 of the PCB 104. In addition, the conductive shield 120 may be substantially continuous. For example, as illustrated in FIG. 1, the conductive shield 120 may have no apertures, apart from the side corresponding to the plane of the PCB 104 being open and any provided gaps 136 or space between mounting tabs 140. By providing a continuous or substantially continuous conductive surface, the conductive shield 120 prevents or reduces the generation of radiation due to currents conducted by the conductive shield 120. A continuous or substantially continuous conductive shield 120 as illustrated in FIG. 1 may be formed from any electrically conductive material. For example, the conductive shield 120 may be formed from a folded plate of sheet metal. Suitable metals include copper, aluminum, silver or gold.

Figure 2:
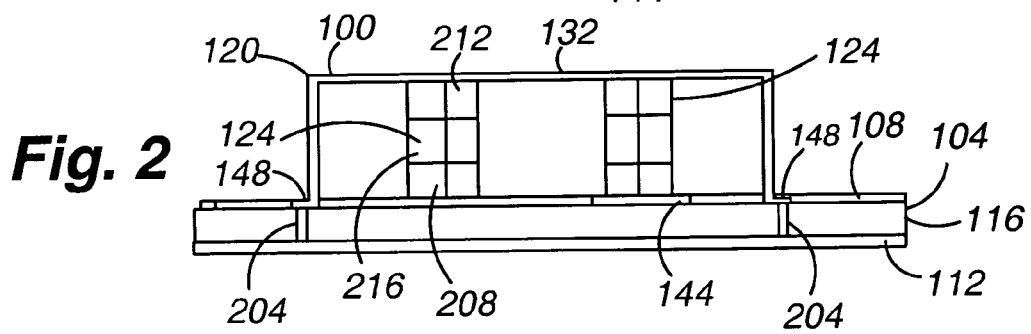
FIG. 2 is a cross-section of the filter bank and printed circuit board of FIG. 1.

With reference now to FIG. 2, a cross-section of the filter bank 100 and PCB 104 of FIG. 1 is shown. In general, the cross-section illustrated in FIG. 2 is taken along section line A—A of FIG. 1. As seen in FIG. 2, each capacitive element 124 is interconnected to a corresponding conductive trace 108 of the PCB 104 at a first end, and to the circuit element attachment surface 132 of the conductive shield 120 at a second end. To provide a sufficient area for attaching a corresponding capacitive element 124, each conductive trace 108 may be widened at the attachment point of a corresponding capacitive element 124, to form an attachment pad 144 (see also FIG. 1). The conductive shield 120 is interconnected to the ground plane 112 of the PCB 104 by electrical vias 204 passing through the substrate 116 of the PCB 104. In order to facilitate the electrical interconnection of the conductive shield 120 to the vias 204, connection tabs 148 (see also FIG. 1) may be provided. In order to facilitate the manufacture of the high density capacitor filter bank 100 in accordance with the present invention, and to facilitate the attachment of such a filter bank 100 to a PCB 104, it is generally preferable to use like-sized capacitive elements 124. In accordance with such an embodiment, the areas of the circuit element attachment surface 132 corresponding to attachment points of the second ends of the capacitive elements 124 should be a uniform distance from the pads 144 of the conductive traces 108. In particular, that distance should be substantially equal to the length of the capacitive elements 124. Therefore, the capacitive element attachment surface 132 may comprise a planar surface that is substantially parallel to the surface of the PCB 104. In addition, the distance between the capacitive element attachment surface 132 and the surface of the PCB 104 may be such that a high density capacitor filter bank 100 in accordance with an embodiment of the present invention comprises a low profile component.

In order to reduce the area of the PCB 104 taken up by the high density capacitor filter bank 100, the capacitive elements 124 are mounted such that they are substantially orthogonal to the plane of the PCB 104. This configuration also prevents the recoupling of noise currents back into the conductive traces 108, and facilitates the routing of conductive traces 108 on the PCB 104.

Figure 3:
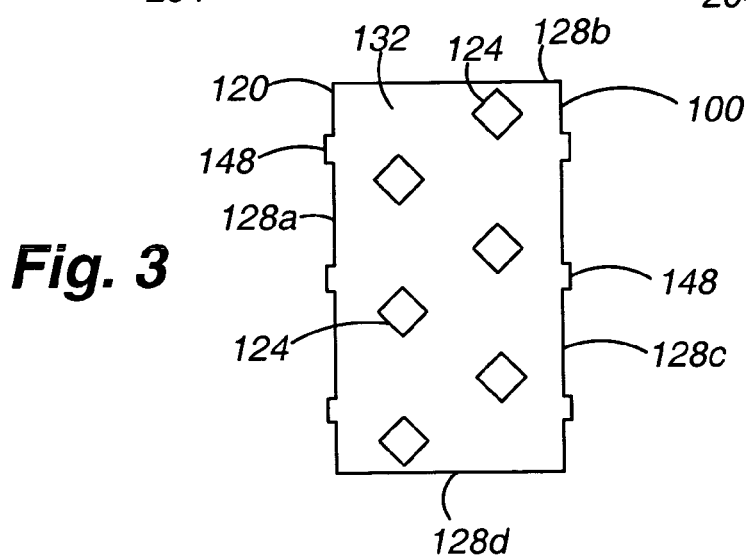
FIG. 3 is a plan view of a filter bank in accordance with an embodiment of the present invention.

FIG. 3 is a plan view of the high density capacitor filter bank 100 shown in FIGS. 1 and 2. In particular, FIG. 3 shows a high density capacitor filter bank 100 in accordance with an embodiment of the present invention, as it would appear from the surface of the PCB 104 to which the high density capacitor filter bank 100 would be mounted. As best seen in FIG. 3, the capacitive elements 124 may be arranged in staggered rows, to facilitate the routing of conductive traces 108. Although such an arrangement may be convenient, it should be appreciated that the filter elements 124 may be arranged in any configuration deemed desirable or necessary given the configuration of the PCB 104 to which the high density capacitor filter bank 100 is to be attached.

Figure 5B:
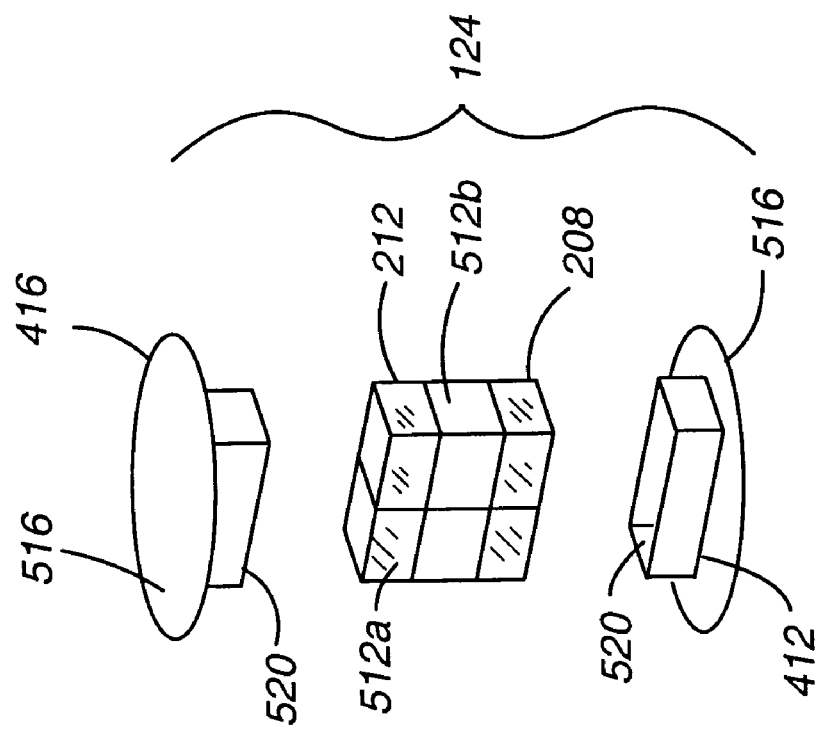
FIG. 5B is an exploded view of the capacitive element of FIG. 4B.
Figure 4B:
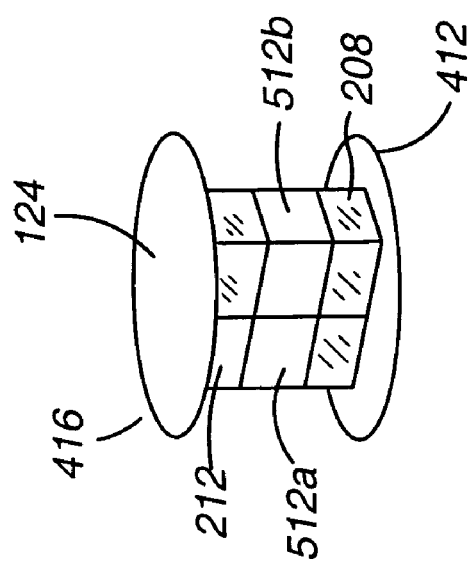
FIG. 4B is a perspective view of a capacitive element in accordance with another embodiment of the present invention.

As shown in FIGS. 2, 4A, 4B, 5A and 5B, the capacitive elements 124 generally include first 208 and second 212 terminals or plates, separated by a dielectric 216. As shown in FIGS. 4A and 5A, first 404 and second 408 end caps may be provided to facilitate interconnection of the capacitive elements 124 having a single capacitor 512 to the conductive shield 120 and attachment pads 144 formed on or as part of the PCB 104. The capacitive values are selected such that a relatively low impedance is presented to noise within an interconnected conductive trace 108. In addition, the capacitive values of the capacitive elements 124 are selected such that a relatively high impedance is presented to desired signals in the conductive traces 108. Alternatively, as shown in FIGS. 4B and 5B, capacitive elements 124 having multiple capacitors 512 held between end caps 412 and 416 may be provided. The use of multiple capacitors 512 can facilitate the filter over a larger frequency range.

With reference now to FIG. 5A, the capacitive element 124 of FIG. 4A is shown in an exploded view. As shown in FIG. 5A, each end cap 404, 408 may include a planar mounting surface 504 and a receptacle 508. In general, the planar surface 504 provides a relatively large surface area for interconnecting (e.g., soldering) the capacitive element 124 to the PCB 104 at a first end and to the capacitive element attachment surface 132 of the conductive shield 120 at a second end. The receptacle 508 provides a mechanical structure in which the terminals 208, 212 can be held. In accordance with an embodiment of the present invention, the terminals 208, 212 and dielectric 216 of each capacitive element 124 are provided as a conventional surface mount capacitor 512. For example, the capacitor 512 may comprise an 0603 or an 0402 capacitor. Such devices are easily obtainable, and are available in a wide variety of capacitive values. Where capacitors 512 having different sizes are used in connection with the same high density capacitor filter bank 100, certain or all of the end caps 404, 408 may perform a spacing function so that the capacitive elements 124 all have the same length. In FIG. 5B, the capacitive element 124 of FIG. 4B is shown in an exploded view. As shown in FIG. 5B, each end cap 412, 416 has a planar mounting surface 516, and a receptacle 520 sized to accommodate the included capacitors (e.g., first capacitor 512a and second capacitor 512b). Although FIGS. 4B and 5B show a capacitive element 124 with two capacitors 512, different numbers of capacitors 512 can be provided.

Figure 6:
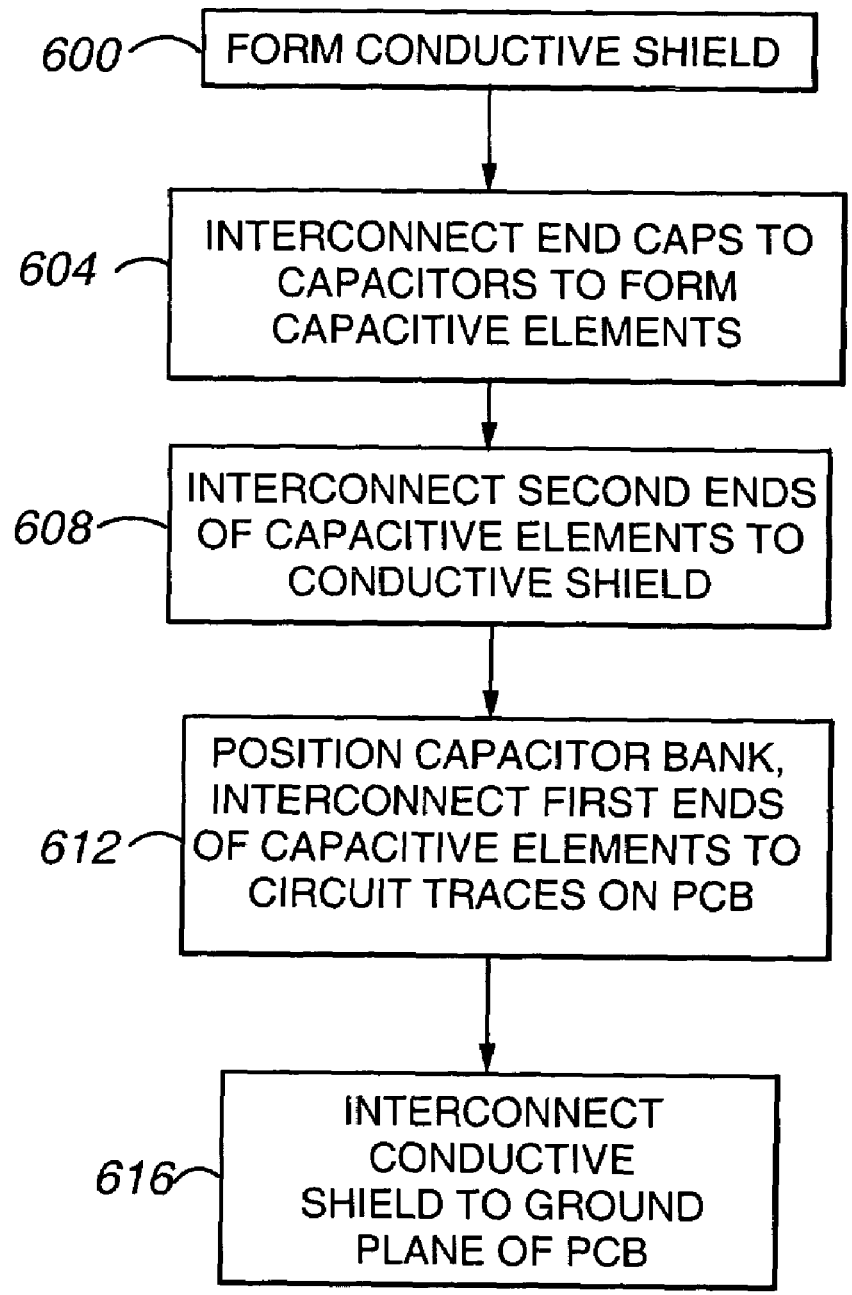
FIG. 6 is a flow diagram of a method for providing a high density capacitor filter bank in accordance with an embodiment of the present invention.

With reference now to FIG. 6, a method for providing a high capacity filter bank in accordance with an embodiment of the present invention is illustrated. Initially, at step 600, the conductive shield 120 is formed. In accordance with an embodiment of the present invention, the conductive shield is formed by folding an appropriately patterned piece of electrically conductive sheet metal. At step 604, end caps 404, 408 are interconnected to opposite terminals 208, 212 of capacitors 512, to form capacitive elements 124. In accordance with an embodiment of the present invention, the end caps 404, 408 are interconnected to the respective terminals or plates 208, 212 of each capacitor 412 using a conductive adhesive or by soldering. As noted above, the capacitive value of each capacitor 412 is selected to present a relatively low impedance to noise, while presenting a relatively high impedance to desired signals carried by a conductive trace 108 to which the capacitive element 124 is to be interconnected. This allows the capacitive element 124 incorporating the capacitor 412 to shunt noise to ground, while allowing non-noise signals to pass through the conductive trace 108 relatively unimpeded.

At step 608, an end of each capacitive element 124 is interconnected to the capacitive element attachment surface 132 of the conductive shield. Each capacitive element is positioned so that it will mate with a corresponding attachment pad 144 on the PCB 104. For example, as shown in FIGS. 1, 2 and 3, the second end cap 408 of each capacitive element 124 may be soldered to the capacitive element attachment surface 132 of the conductive shield 120. The interconnection of the capacitive elements 124 to the conductive shield 120 completes assembly of the high density capacitor filter bank 100.

At step 612, the high density capacitor filter bank 100 is positioned such that the end caps 404 of each capacitive element 124 opposite the capacitive element attachment surface 132 of the capacitive shield 120 is over a corresponding attachment pad 144 on the surface of the PCB 104 and each connection tab 148 provided by the conductive shield is over a corresponding via 204 of the PCB 104. Next, each capacitive element 124 is interconnected to a corresponding mounting pad 144, and each connecting tab 148 is interconnected to a corresponding via 204 (step 616), for example by soldering.

When a circuit or circuits associated with the PCB 104 is in operation, signals are conducted by the conductive traces 108. Noise, such as may be created by integrated circuits or other componentry interconnected to the conductive traces 108 is shunted to ground by the high density capacitor filter bank 100. In particular, the capacitive value of each capacitive element 124 is selected such that a low impedance path to ground is presented to noise within a corresponding trace 108, while a relatively high impedance is presented to desired signals within the corresponding conductive trace 108. Accordingly, desired signals are allowed to pass along the conductive trace 108, while noise signals are filtered out. As the noise signals pass through the capacitive elements 124, they travel away from the conductive traces 108 in a direction that is substantially orthogonal to the plane of the PCB 104. Accordingly, recoupling of the noise back into the conductive traces 108 is substantially prevented. After passing through the capacitive elements 124, the noise signals are conducted by the conductive shield 120 to the vias 204 provided in the PCB 104, and then to the ground plane 112, from which the noise signals may return to their source. Because the conductive shield 120 is substantially continuous, conduction of the noise signals by the conductive surface 120 does not result in the free space propagation of those signals.

In accordance with other embodiments of the present invention, the conductive shield 120 may be provided with apertures or holes, for example to provide air flow for the cooling of componentry within or beneath the conductive shield 120. The maximum linearly dimension of any apertures provided in the conductive shield 120 should be small enough that the free space propagation of electromagnetic radiation is substantially prevented. The maximum linear dimension of apertures in the conductive shield 120 can be determined from the wavelength of signals at frequencies of concern (i.e., at frequencies comprising noise). For example, in accordance with an embodiment of the present invention, the maximum linear dimension of an aperture within a conductive shield 120 is given by the wavelength of the highest noise frequency of concern divided by thirty. Thus, if the highest noise frequency of concern was 2 gigahertz, which has a wavelength of about $1.5 \times 10^{-1}$ m, the largest linear dimension of any aperture in the conductor shield 120 itself should be no larger than about 0.5 cm. Thus, if cooling is of particular concern, and air flow through the conductive shield 120 is desirable, a large number of relatively small apertures is preferable to a smaller number of larger apertures.

In accordance with an embodiment of the present invention, the capacitive elements 124 are arranged such that a first end surface of each capacitive element 124 lies substantially within a first plane proximate the surface of the PCB 104 when the high density capacitor filter bank 100 is interconnected to the PCB 104. A second end of each capacitive element 124 is proximate to a second plane defined by the capacitive element attachment surface 132 of the conductive shield.

In accordance with another embodiment of the present invention, the attachment surface 132 is not planar, but is shaped to provide an appropriate spacing between the attachment surface 132 and the PCB 104 at points where capacitive elements are attached. For example, the attachment surface 132 may be stepped or corrugated. In addition, a non-planar attachment surface may be provided to facilitate the use of capacitive elements 124 of different lengths. In accordance with still other embodiments of the present invention, a high density capacitor filter bank 100 need not be rectangular in plan view. Instead, any shape considered desirable to facilitate attachment of a high density capacitor filter bank 100 to a PCB 104, and/or to facilitate manufacture of the high density capacitor filter bank 100 may be used.

The foregoing discussion of the invention has been presented for purposes of illustration and description. Further, the description is not intended to limit the invention to the form disclosed herein. Consequently, variations and modifications commensurate with the above teachings, within the skill and knowledge of the relevant art, are within the scope of the present invention. The embodiments described hereinabove are further intended to explain the best mode presently known of practicing the invention and to enable others skilled in the art to utilize the invention in such or in other embodiments and with various modifications required by their particular application or use of the invention. It is intended that the appended claims be construed to include the alternative embodiments to the extent permitted by the prior art.

What is claimed is:

1. A device for filtering noise in a printed circuit board, comprising:
   a multiple layer circuit board having a plurality of conductive traces, wherein at least a first plurality of said conductive traces are located within a first plane;
   a first capacitive element, wherein said first capacitive element includes a dielectric interposed between a first conductive end and a second conductive end, wherein said first circuit element is oriented such that said first conductive end is proximate to said first plane and interconnected to a first conductive trace included in said first plurality of conductive traces and such that said second conductive end is distal from said first plane;
   a second capacitive element, wherein said second capacitive element includes a dielectric interposed between a first conductive end and a second conductive end, wherein said second circuit element is oriented such that said first conductive end is proximate to said first plane and interconnected to a second conductive trace included in said first plurality of conductive traces and such that said second conductive end is distal from said first plane; and
   a conductive shield, wherein said conductive shield substantially encloses a volume adjacent said circuit board and including said first and second capacitive elements, wherein said second ends of each of said first and second capacitive elements are electrically interconnected to said conductive shield, and wherein said conductive shield is electrically interconnected to a ground plane of said printed circuit board.

2. The device of claim 1, wherein said conductive shield comprises a Faraday shield.

3. The device of claim 1, wherein said first and second capacitive elements comprise surface mount capacitors.

4. The device of claim 1, wherein said first and second capacitive elements are selected to provide a low impedance to signals at frequencies associated with electronic noise.

5. The device of claim 1, wherein a first end of each of said first and second conductive traces is interconnected to a pin of an integrated circuit, and wherein said ground plane of said printed circuit board is interconnected to a ground pin of said integrated circuit.

6. The device of claim 5, wherein a second end of each of said first and second conductive traces is interconnected to a back plane assembly.

7. A noise suppression device, comprising:
   a plurality of capacitors, wherein each of said capacitors includes first and second plates separated by a dielectric; and
   a conductive shield element defining a volume substantially containing said capacitors and electrically interconnected to said second plate of each of said capacitors wherein at least a one of said capacitors presents a very low impedance to a frequency comprising noise.

8. The device of claim 7, wherein said first end of each of said capacitors is intersected by a first plane.

9. The device of claim 8, wherein said second end of each of said capacitors is interconnected to a surface of said conductive shield element defining a second plane, and wherein said first plane is substantially parallel to said first plane.

10. A noise suppression device, comprising:
    a plurality of capacitive elements, wherein each of said capacitive elements includes first and second plates separated by a dielectric; and
    a conductive shield element defining a volume substantially containing said capacitive elements and electrically interconnected to said second plate of each of said capacitive elements, wherein said conductive shield element comprises a Faraday shield.

11. The device of claim 7, wherein said conductive shield element is formed from a sheet of material.

12. A noise suppression device, comprising:
    a plurality of capacitive elements, wherein each of said capacitive elements includes first and second plates separated by a dielectric; and
    a conductive shield element defining a volume substantially containing said capacitive elements and electrically interconnected to said second plate of each of said capacitive elements, wherein said conductive shield element has no holes greater than 0.5 cm in diameter.

13. A high capacity filter bank, comprising:
    means for shunting noise signals, wherein a low impedance is presented to signals having at least a first frequency and a high impedance is presented to signals having at least a second frequency; and
    means for providing a substantially shielded volume, wherein said means for shunting noise signals are substantially contained within said shielded volume, and wherein a terminal of said means for shunting noise signals is electrically interconnected to said means for providing a substantially shielded volume.

14. The high capacity filter bank of claim 13, wherein said means for providing a substantially shielded volume conducts said noise signals without producing substantial electromagnetic radiation.

15. A method for filtering noise from a circuit, comprising:
    providing a plurality of capacitive elements having first and second terminals, wherein a capacitive value of each of said elements is selected to present a low impedance to noise frequencies in a corresponding circuit;
    providing a shield element that substantially prevents the propagation of free space radiation at said noise frequencies; and
    interconnecting said second terminal of each of said capacitive elements to said shield element, wherein said first terminals of said capacitive elements are located within a first plane.

16. The method of claim 15, further comprising:
    providing a multiple layer circuit board; and
    interconnecting said first terminals of said capacitive elements to circuit traces on said circuit board.

17. The method of claim 16, further comprising interconnecting said shield element to a ground plane included in said circuit board.

18. The method of claim 15, wherein said step of interconnecting said second terminals of said capacitive elements to said shield element comprises interposing conductive cap members between said second terminals and said shield element.

19. The method of claim 17, wherein said step of interconnecting said shield element to said ground plane comprises interconnecting said shield element to vias at a first surface of said circuit board.

20. The method of claim 16, wherein said step of interconnecting said first terminals of said capacitive elements to circuit traces on said circuit board comprises providing a plurality of conductive cap members and interposing a conductive cap member between said first terminal of each capacitive element and a corresponding circuit trace.

* * * * *